United States Patent
Mahawili

(10) Patent No.: US 6,530,994 B1
(45) Date of Patent: *Mar. 11, 2003

(54) PLATFORM FOR SUPPORTING A SEMICONDUCTOR SUBSTRATE AND METHOD OF SUPPORTING A SUBSTRATE DURING RAPID HIGH TEMPERATURE PROCESSING

(75) Inventor: Imad Mahawili, Grand Rapids, MI (US)

(73) Assignee: Micro C Technologies, Inc., Kentwood, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/419,555

(22) Filed: Oct. 18, 1999

Related U.S. Application Data

(63) Continuation-in-part of application No. 08/912,242, filed on Aug. 15, 1997, now Pat. No. 6,090,212, and a continuation-in-part of application No. 08/979,604, filed on Nov. 26, 1997, now Pat. No. 6,007,635.

(51) Int. Cl.$^7$ .................. H01L 21/00; C23C 16/00
(52) U.S. Cl. ................. 118/725; 118/728; 156/345.52
(58) Field of Search ................. 118/715, 728, 118/724, 725; 156/345.52, 345.51

(56) References Cited

U.S. PATENT DOCUMENTS

| | | | |
|---|---|---|---|
| 4,550,684 A | 11/1985 | Mahawili | 118/724 |
| 4,680,447 A | 7/1987 | Mahawili | 219/343 |
| 4,993,358 A | 2/1991 | Mahawili | 118/715 |
| 5,155,336 A | 10/1992 | Gronet et al. | 219/411 |
| 5,310,260 A | 5/1994 | Schietinger et al. | 374/142 |
| 5,317,492 A | 5/1994 | Gronet et al. | 362/294 |
| 5,366,002 A | 11/1994 | Tepman | 165/1 |
| 5,487,127 A | 1/1996 | Gronet et al. | 392/416 |
| 5,490,728 A | 2/1996 | Schietinger et al. | 374/128 |
| 5,531,835 A | 7/1996 | Fodor et al. | 118/728 |
| 5,566,744 A | 10/1996 | Tepman | 165/80.1 |
| 5,673,167 A | 9/1997 | Davenport et al. | 361/234 |
| 6,090,212 A * | 7/2000 | Mahawili | 118/500 |
| 6,133,152 A * | 10/2000 | Bierman et al. | 118/730 |
| 6,325,858 B1 * | 12/2001 | Wengert et al. | 118/715 |

FOREIGN PATENT DOCUMENTS

JP 11-79888 * 3/1999

* cited by examiner

Primary Examiner—Thi Dang
(74) Attorney, Agent, or Firm—Van Dyke, Gardner, Linn & Burkhart, LLP

(57) ABSTRACT

A platform for supporting a semiconductor substrate during processing in a processing chamber includes a body having a first support surface for supporting the substrate thereon and a second support surface for being supported by a rotatable housing over a heater in the processing chamber. The body comprises a quartz material, with at least a portion of the quartz material being adapted to be opaque to block transmission of photon energy through that portion during heating. For example, the quartz material may include a coating over at least a portion of the quartz material, with the coating adapting the quartz material to be opaque. In preferred form, the coating comprises a composite film of silicon and silicon carbide.

41 Claims, 8 Drawing Sheets

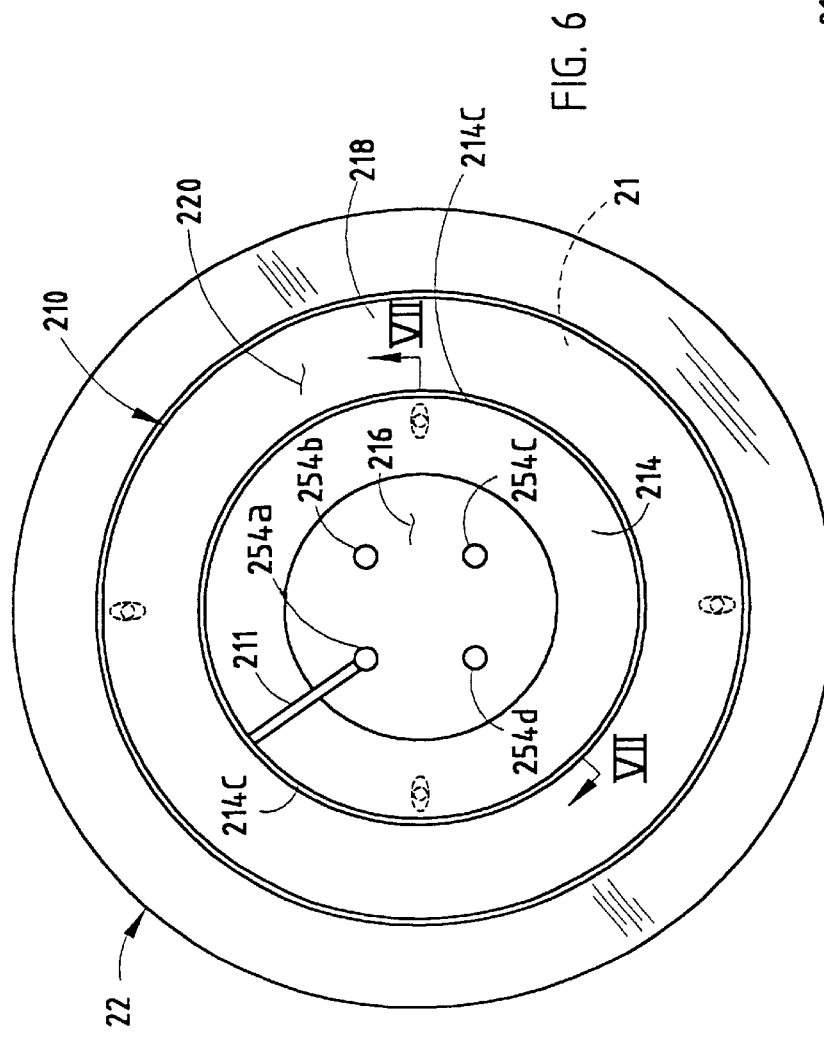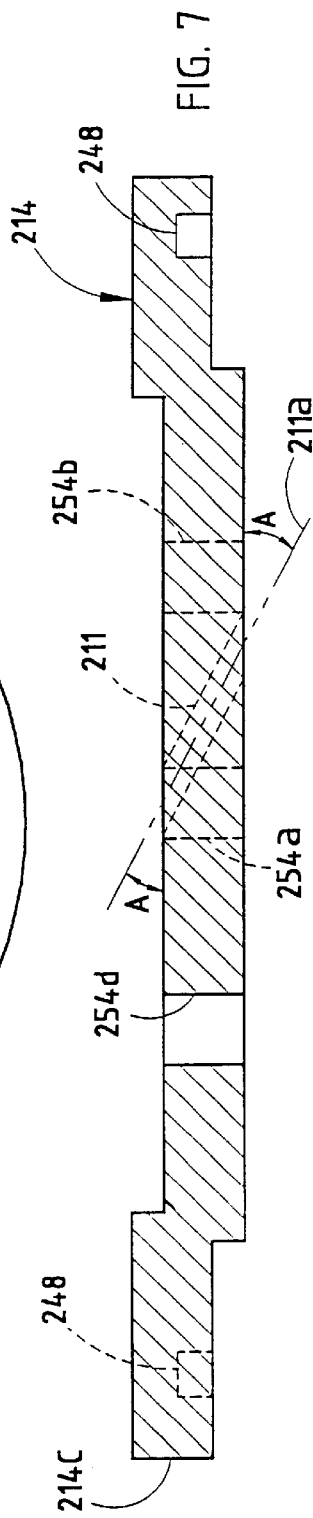

PLATFORM FOR SUPPORTING A SEMICONDUCTOR SUBSTRATE AND METHOD OF SUPPORTING A SUBSTRATE DURING RAPID HIGH TEMPERATURE PROCESSING

This is a continuation-in-part of patent application Ser. No. 08/912,242 entitled A SUBSTRATE PLATFORM FOR A SEMICONDUCTOR SUBSTRATE DURING RAPID HIGH TEMPERATURE PROCESSING AND METHOD OF SUPPORTING A SUBSTRATE filed on Aug. 15, 1997 U.S. Pat. No. 6,090,212, and of patent application Ser. No. 08/979,604 filed Nov. 26, 1997, U.S. Pat. No. 6,007,635 entitled PLATFORM FOR SUPPORTING A SEMICONDUCTOR SUBSTRATE AND METHOD OF SUPPORTING A SUBSTRATE DURING RAPID HIGH TEMPERATURE PROCESSING, which are incorporated by reference herein in their entireties.

BACKGROUND AND TECHNICAL FIELD OF THE INVENTION

The present invention relates to a platform for a processing chamber and, more particularly, to a platform for supporting semiconductor substrates during thermal processing and chemical deposition of thin film applications, for example, during film deposition, oxide growth, etching, and thermal annealing.

When heating a substrate, it is desirable to heat the substrate rapidly and in a uniform manner so that all the regions of the substrate are heated to the same temperature. Rapid heating of the substrate reduces processing time and, therefore, increases the processing rate for a given substrate. Ultimately, with increased processing rates the cost of processing a semiconductor substrate is reduced. Furthermore, when processing semiconductor substrates it is desirable to limit impingement of the processing gases, which form the thin film depositions on the substrate, on to a single side—the device side—of the substrate.

Conventional platforms typically support the semiconductor substrate by the peripheral portion of the semiconductor substrate. In this manner, both the top and bottom surfaces of the substrate are exposed, which permits rapid heating of the substrate. However, with these configurations, the non-device side of this semiconductor substrate is not isolated from the process gases, which may result in undesirable depositions being formed on the nondevice side of the substrate.

In U.S. Pat. No. 5,487,127, to Gronnet et al., the semiconductor substrate is supported at its peripheral edge by an annular support and is heated by plurality of light pipes which are positioned on one side of the substrate and treated by process gases by a shower-head-like gas injection system which is positioned on the other side of the substrate. However, with the increase in the size of wafers, this sort of arrangement may result in warpage of the semiconductor substrate since it is supported only at its peripheral edge.

In U.S. Pat. No. 4,834,022, to Mahawili, a chemical vapor deposition reactor is disclosed which includes a heater platform which provides uniform support to the wafer. The platform includes a recessed circular well for holding the semiconductor wafer therein. While the size of the platform can be increased to accommodate larger substrates, as the dimensions of the platform increase, the thickness necessarily increases in order to provide sufficient structural capacity. However, as the thickness of the platform increases the heat transfer rate reduces. Hence, the rapid processing of the semiconductor substrates may be impaired because of the reduced heat transfer rates.

More recently, platforms for supporting a semiconductor substrate during rapid high temperature processing have been made from silicon carbide coated graphite. In some processes, the thermal shock characteristics of the silicon carbide coated graphite platforms can limit the platforms' application. While other materials, such as quartz, generally exhibit greater thermal shock characteristics, quartz has other characteristics that limit its application. Since the substrate holder also acts as an isolating medium for light transmission, quartz has heretofore been found unsuitable in such application since quartz is transparent over most temperature ranges.

Consequently, there is a need for a platform which can support a semiconductor substrate during thermal processing in a manner to limit depositions of processing gases to a single side—the device side—of the substrate and permit rapid heating of the substrate. Furthermore, there is a need for a platform which has sufficient structural integrity to support large semiconductor substrates, on the order of up to 300 mm or greater, without impeding the heat transfer from the heater source to the substrate. Additionally, there is a need for a platform which can provide support for a semiconductor substrate during rapid high temperature processing while also limiting light transmission, thus isolating the reactor chamber from stray light, which could interfere with certain processes, for example emissivity measurements.

SUMMARY OF THE INVENTION

As will be understood, the platform of the present invention provides numerous advantages over prior known platforms. The platform provides a support for a semiconductor substrate during thermal processing in a manner that permits the non-device side of the substrate to be isolated from the processing chamber in a conventional processing reactor. At the same time, the platform permits the heat transfer from the heater assembly of the reactor to the substrate to be maximized and, yet, provides a platform which can support semiconductor substrates on the order of 300 mm in diameter or greater. The platform further isolates the substrate from light transmission from the heater assembly.

In one form, a platform for supporting a semiconductor substrate during processing in a processing chamber, which includes a heater and a rotatable housing, includes a body having a first support surface for supporting the substrate thereon and a second support surface for being supported by the rotatable housing over the heater in the processing chamber. The body comprises a quartz material, with at least a portion of the quartz material being adapted to be opaque to block transmission of photon energy through that portion during heating.

In preferred form, the quartz material includes a coating over at least a portion of the quartz material, with the coating adapting the quartz material to be opaque. For example, the coating may comprise a composite film of silicon and silicon carbide.

In other forms, the body comprises first and second member, with the first member including a first support surface and the second member including a second support surface and a third support surface. The third support surface supports the first member on the second member and the second support surface is provided for being supported by the rotatable housing.

In another form of the invention, a platform for supporting a semiconductor substrate during processing in a processing chamber, which includes a heater and a rotatable housing, includes first and second member. The first member includes a first support surface for supporting a substrate. The second member includes second and third support surfaces, with the first member being supported on the second support surface of the second member. The third support surface is for supporting the first and second members in the processing chamber over the heater by the rotatably housing. At least one of the first and second members comprises a quartz material, with at least a portion of the quartz material being adapted to be opaque to limit transmission of light from the heater to the processing chamber.

For example, the quartz material may include a coating over that portion, with the coating adapting the quartz material to be opaque. Preferably, the coating comprises a composite film of silicon and silicon carbide.

A method of making a platform for use in high temperature processing according to the present invention includes providing a quartz body, which is dimensioned for use as a substrate processing chamber platform, and forming a coating on at least a portion of the quartz material for adapting a quarts body to be opaque.

In one aspect, the coating is formed by depositing a film of silicon and silicon carbide. Preferably, the film is uniformly deposited. The quartz body is preferably heated to a temperature in a range of 700° to 1100° C. while depositing the silicon and silicon carbide onto the quartz body. More preferably, the quartz body is heated to a temperature in a range of approximately 900° to 1000° C. In other aspects, the film of silicon and silicon carbide is deposited onto the quartz body under pressure in a range of 50 to 400 Torr and more preferably in a range of 200 to 350 Torr. The coating is formed in a process which extends over a deposition time in a range of about 2 to 5 hours.

In other forms, the quartz body is placed in a chamber of a high temperature oven, and an organo-silane gas and hydrogen gas are injected into the chamber. The quartz body is heated to a temperature in a range of approximately 700° to 1100° C. and the chamber is pressurized to a pressure in a range of approximately 50 to 400 Torr.

These and other objects, advantages, purposes and features of the invention will be apparent to one skilled in the art from a study of the following description taken in conjunction with the drawings.

DESCRIPTION OF THE DRAWINGS

FIG. 6 is a plan view of a third embodiment of the platform;

FIG. 7 is sectional view taken along line VII—VII of FIG. 6.

DESCRIPTION OF THE PREFERRED EMBODIMENTS

Referring now to FIGS. 1–4, a platform for supporting a semiconductor substrate during thermal processing in a chemical vapor deposition reactor is generally indicated by the numeral 10. In the illustrated embodiment, platform 10 comprises a single wafer processing platform that is suitable for supporting a semiconductor substrate 12 during various fabrication processes, such as thermal annealing, thermal reflow of boro-phosphorous gases, and chemical vapor deposition of thin film applications, including high temperature oxide, low temperature oxide, high temperature nitride, doped and undoped polysilicon, silicon epitaxial and tungsten metal and tungsten silicide films, in the fabrication of semiconductor devices. As will be described in more detail, platform 10 comprises a composite platform which is especially suited for use in a chemical vapor deposition reactor, such as reactor 13 shown in FIGS. 3 and 4, which is described in more detail in application Ser. No. 08/911,638 entitled REACTOR AND METHOD OF PROCESSING A SEMICONDUCTOR SUBSTRATE filed on Aug. 15, 1997, by Imad Mahawili, which is now issued as U.S. Pat. No. 5,814,365, which is incorporated by reference in its entirety herein. But it should be understood that platform 10 may be used in other processing reactors.

Figure 1:
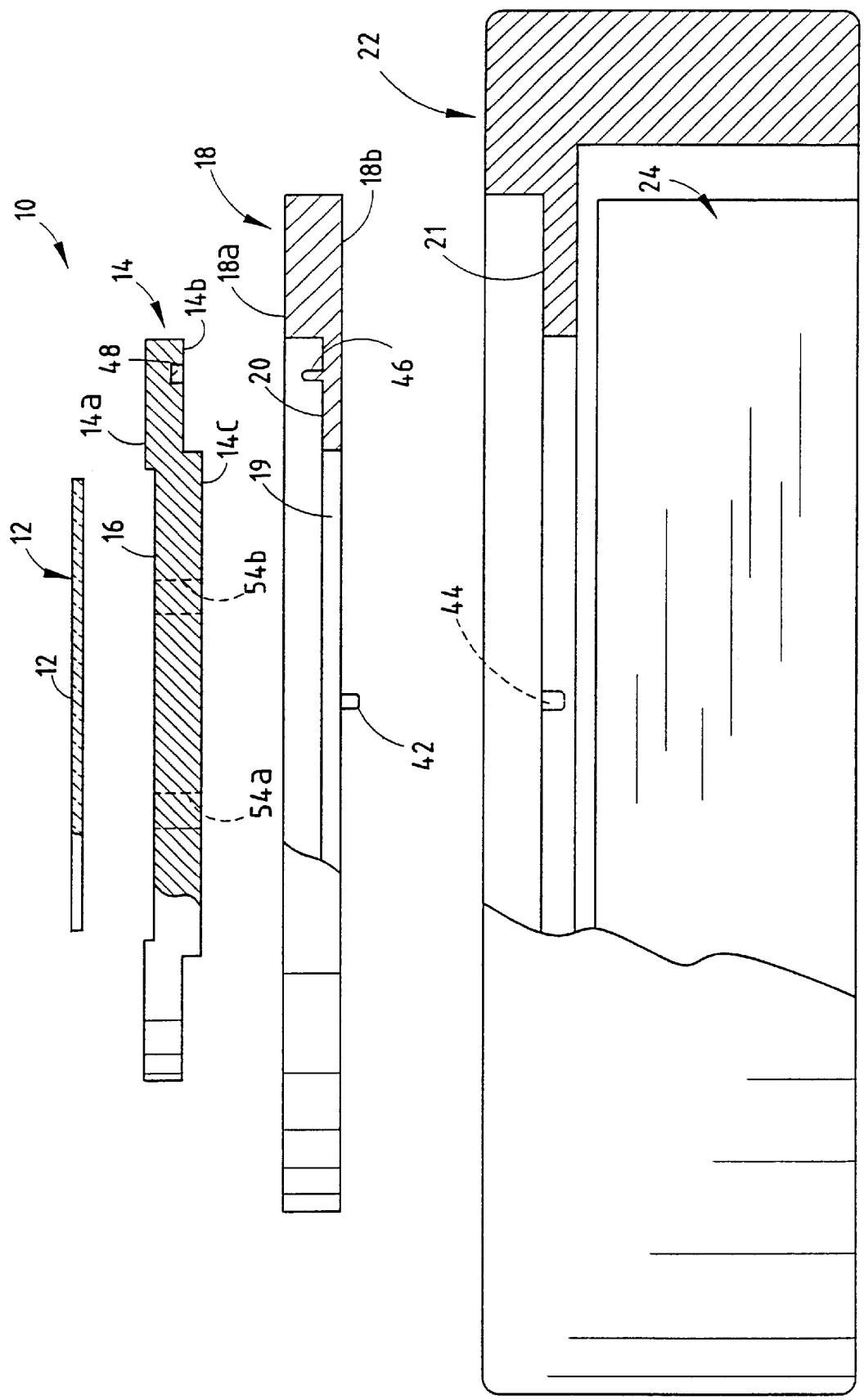
FIG. 1 is an exploded segmented partial cross-section view of the platform of the present invention.

Referring to FIG. 1, platform 10 includes a first member 14, which provides a generally planar support surface 16 for substrate 12. Support surface 16 is sized to permit unrestrained radial expansion of substrate 12 and, furthermore, is recessed to support substrate 12 substantially flush with an upper surface 14a of first member 14. Platform 10 also includes a second member 18, which provides a support surface 20 for first member 14. Support surface 20 is sized to permit radial expansion of first member 14 and recessed to support first member 14 and substrate 12 substantially flush with an upper surface 18a of second member 18. In this manner, processing gases may flow across substrate 12 unimpeded by an irregular surface topology created by the edges of substrate 12 or first member 14.

Figure 2:
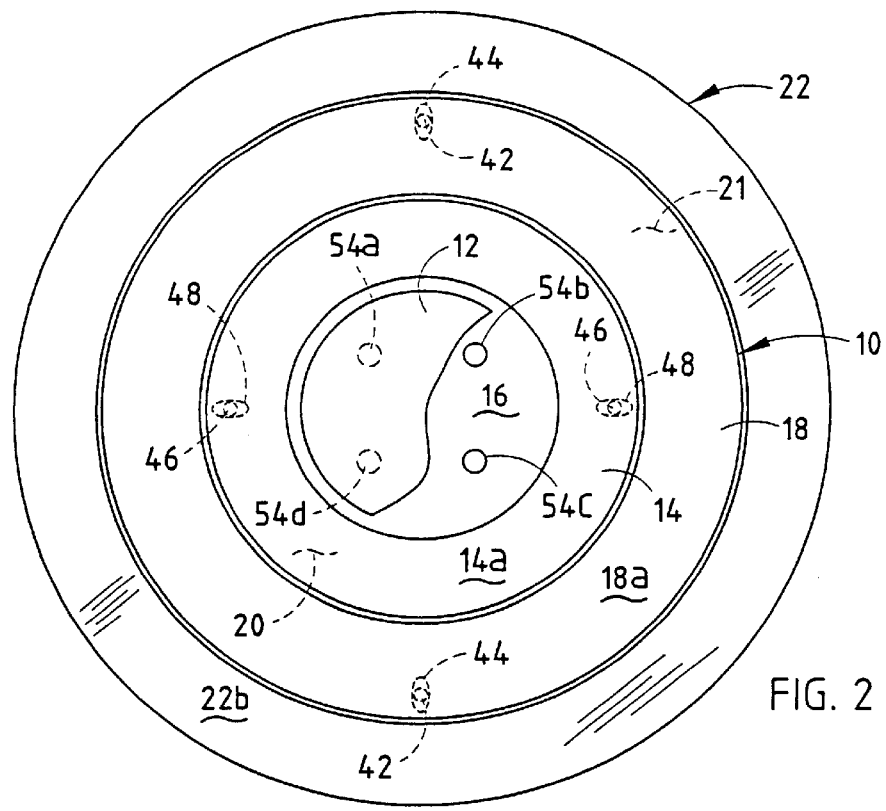
FIG. 2 is a plan view of the platform with a semiconductor wafer supported thereon.
Figure 4:
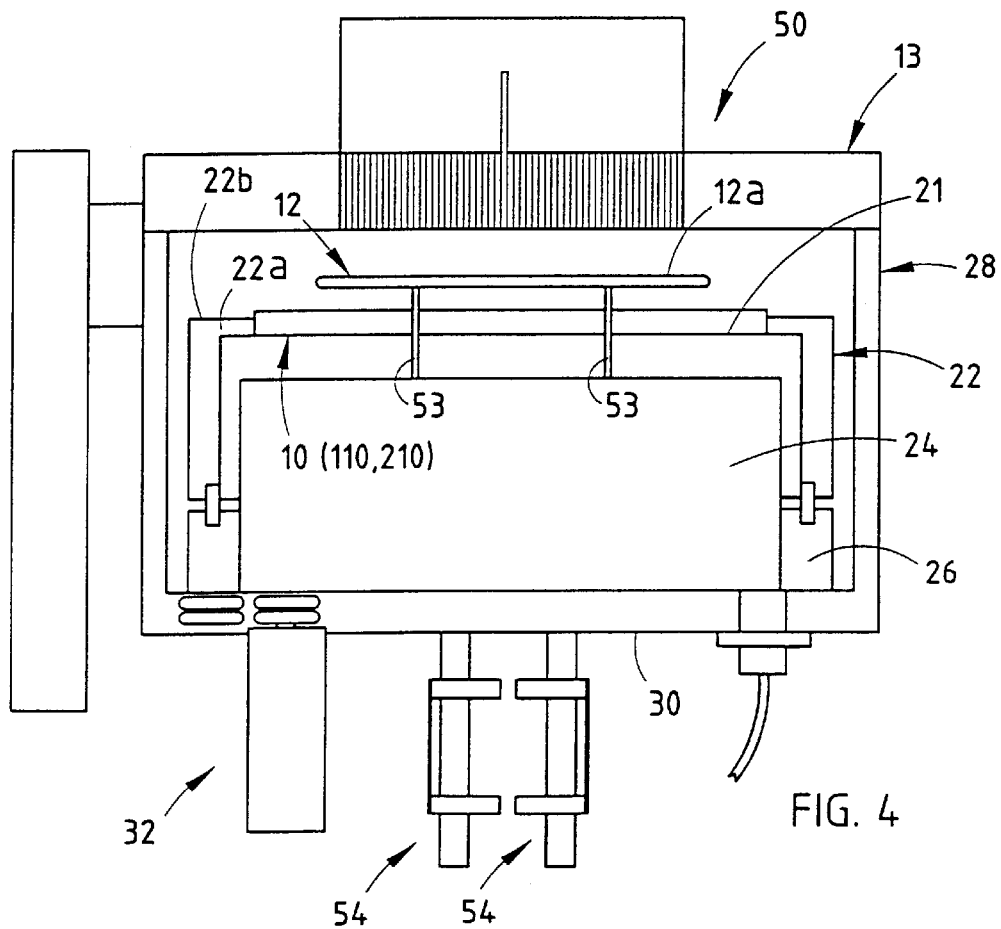
FIG. 4 is a schematic sectional view taken along line IV—IV of FIG. 3.

As best seen in FIGS. 2 and 4, platform 10 is supported in reactor 13 on an annular support surface 21 provided on a rotatable heater housing 22 which is enclosed and vacuum sealed in reactor housing 28 (FIG. 4). Heater housing 22 encloses a heater assembly 24 which provides heat to substrate 12 through platform 10 during processing. Heater assembly 24 is designed to deliver radiant heat to substrate 12 through platform 10 in a manner such that the temperature in the substrate is substantially uniform. In a preferred form, heater assembly 24 includes an array of heating elements such as linear tungsten-halogen lamps (not shown), which emit peak radiation at 0.95 microns and are layered to form a plurality of heating zones, which provide a concentrated heating profile with a greater amount of heat being applied to the outer perimeter of the substrate than the center of the substrate. For further details of heater assembly 24, reference is made to co-pending U.S. Patent application entitled RAPID THERMAL PROCESSING HEATER TECHNOLOGY AND METHOD OF USE, filed on Dec. 4, 1996, Ser. No. 08/759,559, now U.S. Pat. No. 5,951,896, which is incorporated herein by reference in its entirety. It should be understood that other heaters may be used to heat substrate 12; however, heater assembly 24 preferably delivers heat to substrate 12 in a substantially uniform manner.

Referring to FIG. 4, heater assembly 24 is enclosed and, preferably, sealed in heater housing 22, which is mounted on a rotatable base 26 of reactor housing 28. Heater housing 22 is made from a suitable material, such as a ceramic, graphite, or, more preferably, from silicon carbide coated graphite. Heater assembly 24, heater housing 22, and rotatable base 26 are enclosed and vacuum sealed in outer, reactor housing 28 and are supported on a base wall 30 of reactor housing 28. Base 26 and housing 22 are rotatably supported on base wall 30 of housing 28 and are rotated, preferably, using a conventional magnetically coupled drive 32 or other suitable driving devices, which can impart rotation to base 26 through a vacuum seal.

As previously described, substrate 12 is supported in reactor housing 28 on platform 10. Platform 10 comprises a suitable material, such as quartz, pure silicon carbide, silicon carbide coated graphite, zirconia, alumina, aluminum, steel, or the like. For example, when processing a silicon wafer, platform 10 preferably comprises silicon carbide coated graphite. During processing, platform 10 is seated and supported in recessed annular support surface 21 provided in an upper wall 22a of heater housing 22. Annular recessed support surface 21 is sized to permit unrestrained radial thermal expansion of platform 10. Furthermore, the depth of recessed annular support surface 21 is sized so that semiconductor substrate 12, when seated in support surface 16 of platform 10, is substantially flush with the upper surface 22b of heater housing 22.

As described previously, support surface 16 of first member 14 is recessed and defines a first well 38. Well 38 is sized so that substrate 12 is substantially flush with upper surface 14a of first member 14. Preferably, the depth of well 38 is equal to the thickness of substrate 12 plus about twenty-thousandths of an inch. In a similar manner, support surface 20 defines a second well 40 with a depth, preferably, equal to the overall height or thickness of first member 14. Furthermore, recessed annular support surface 21 is preferably recessed in upper wall 22a of housing 22 a depth equal to the thickness or overall height of second member 18. By supporting substrate 12 substantially flush with the top surface of heater housing 22, platform 10 permits a positioning of substrate 12 on heater housing 22 to define a substantially flat surface wherein the raised edges of substrate 12 and platform 10 do not interfere with the gas flow across the wafer surface.

In order to rotatably couple platform 10 to housing 22, second member 18 includes at least one positioning member 42 (FIG. 1), such as a downwardly extending positioning pin which cooperates with a corresponding cooperating surface 44 (FIG. 1), such as a recess, including a groove or an aperture, provided in upper wall 22a of housing 22. Preferably, cooperating member 44 is an elongated or slotted recess to permit unrestricted or unrestrained relative radial thermal expansion of second member 18 and housing 22 during the thermal processing of substrate 12. In a similar manner, second member 18 is rotatably coupled to first member 14 by a positioning member 46 (FIG. 1), such as an upwardly extending positioning pin, which engages a cooperating surface 48, such as a recess, provided in first member 14. Preferably, cooperating surface 48 is a slotted or elongated recess to permit unrestricted or unrestrained relative radial thermal expansion between first member 14 and second member 18.

It should be understood from the foregoing that composite platform 10 provides a substantially planar stacking arrangement which permits unrestrained thermal expansion of the component parts of the platform and substrate 12 and permits the thickness of first member 14 to be minimized to increase the rate of heat transfer from the heater assembly 24 to substrate 12 during thermal processing. At the same time, second member 18 provides reinforcement to first member 14 without impeding the heat transfer rate from heater assembly 24 to substrate 12.

As best seen in FIG. 2, second member 18 preferably comprises a ring-shaped member with annular support surface 20 being defined radially inward of the outer perimeter of ring-shaped member. Referring to FIG. 1, ring-shaped second member 18 has a first cross-section at its outer perimeter and a second, reduced cross-section radially inward of its first cross-section, which defines recessed annular support surface 20. This may be achieved by grinding or machining of recessed annular support surface 20 or other fabrication or manufacturing techniques. First member 14 preferably comprises a disc insert having a substantially uniform thickness across the disc-shaped insert with recessed support surface 16 being defined by a centrally located offset portion of the disc-shaped insert. The offset portion of first member 14 is preferably formed by grinding or machining well 38 into the central portion of first member 14. Furthermore, in order to seat support surface 16 over the opening 19 of ring-shaped second member 18, a lower surface 14b of first member 14 is offset, preferably by grinding or machining. In this manner, when substrate 12 is placed in well 38 and first member 14 is inserted into well 40 of upper second member 18, the upper surface 18a of second member 18 will be substantially flush with upper surface 14a of first member 14 which will be substantially flush with the top surface 12a of substrate 12. Likewise, the lower most surface 14c of first member 14 will be substantially flush with lower surface 18b of second member 18.

By constructing platform 10 from a relatively thin, first member (14), on the order of 0.04" thick, and a thicker second member (18), for example on the order of 0.10 to 0.25 inches thick which reinforces and supports first member 14, platform 10 can accommodate a wide range of substrate sizes. For example, platform 10 can support substrates having diameters of 150, 200, and 300 mm or more. Platform 10 permits the thickness of the member in contact with substrate 12 to be minimized and yet provides sufficient structural integrity to withstand the rapid heat up rates associated with the thermal processing of semiconductor substrates.

Figure 3:
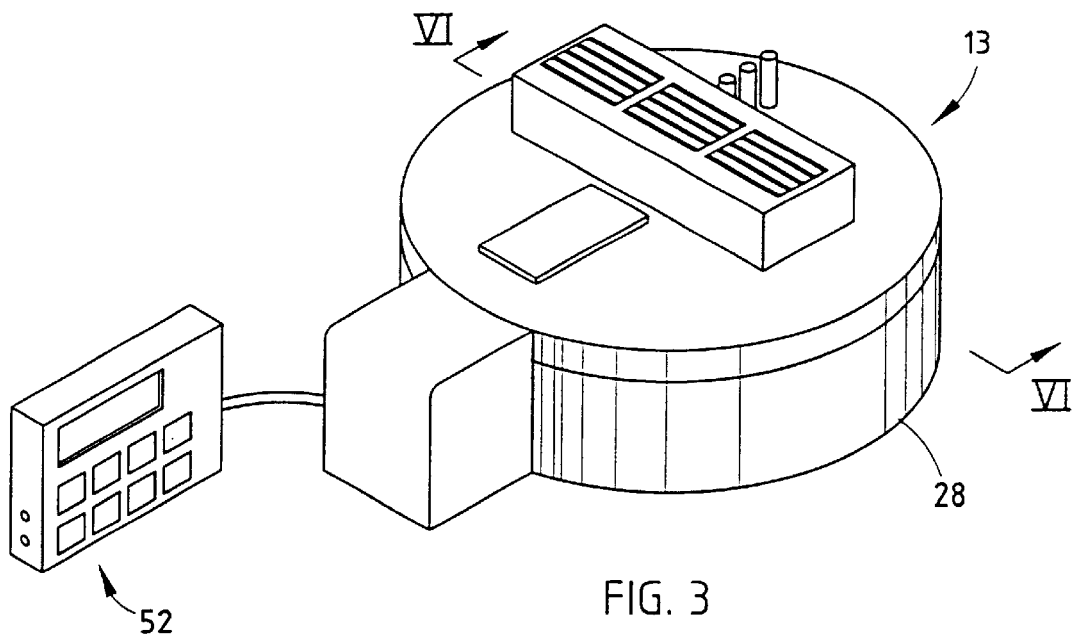
FIG. 3 is a perspective view of a suitable chemical vapor deposition reactor employing the platform of FIG. 1.

Referring to FIGS. 3 and 4, reactor 13 includes a gas injection manifold 50 which injects one or more gases onto a localized or discrete region of the substrate surface wherein thin film deposition takes place. Reactor 13 further includes an emissivity measurement system 52 for measuring the emissivity and calculating the temperature of substrate 12 during the various fabrication processes in order to control the processes. For further details of a suitable gas injection manifold and emissivity measurement system, reference is made to co-pending patent application entitled REACTOR AND METHOD OF PROCESSING A SEMICONDUCTOR SUBSTRATE filed on Aug. 15, 1997, now U.S. Pat. No. 5,814,365, by Imad Mahawili.

After semiconductor substrate 12 has been processed, substrate 12 is raised off platform 10 by a plurality of lifter pins 53 which protrude through and lift substrate 12 off platform 10 for automatic loading and unloading of substrate 12 within reactor 13. Lifter pins 53 are raised and lowered by magnetically coupled wafer lifters 54, which are conventionally known in the art. Pins 53 are centrally located in housing 22 and project through a central portion of the heater assembly 24 and through a central portion of platform 10. In preferred form, at least three lifter pins 53 are provided. In the most preferred form, four lifter pins 53 are provided, and first member 14 includes a corresponding number of openings 54a, 54b, 54c, and 54d to enable lifter pins 53 to protrude through first member 14 and lift substrate 12 off platform 10 for automatic loading and unloading of substrate 12. It can be appreciated that lifter pins 53 can only be operated when housing 22 and platform 10 are positioned so that openings 54a, 54b, 54c, and 54d in first member 14 are aligned with lifter pins 53, for example in a "HOME" position. Therefore, positioning members 42 and 46 and cooperating surfaces 44 and 48 are aligned so that when platform 10 is positioned on heater housing 22, openings 54a, 54b, 54c, and 54d will be properly aligned to allow lifter pins 53 to extend through first member 14 to lift substrate 12 of platform 10 after processing.

Figure 5:
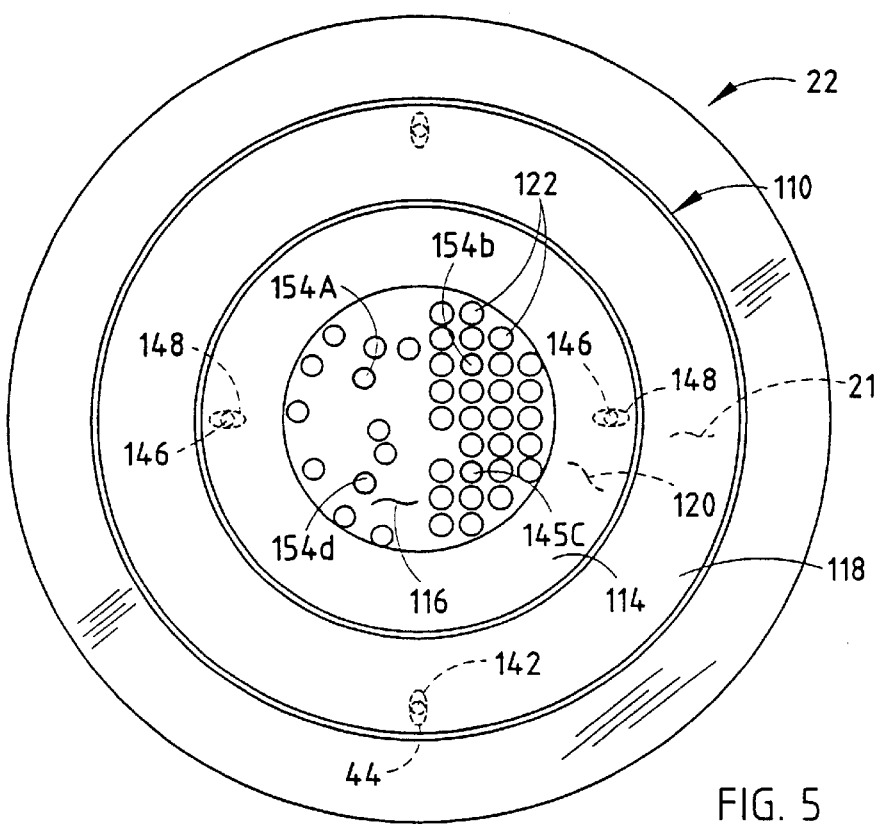
FIG. 5 is a plan view of a second embodiment of the platform.

Referring to FIG. 5, a second embodiment of a platform 110 is illustrated. Platform 110 includes a first member 114 with a first support surface 116, and a second member 118 with a second support surface 120. Similar to the previous embodiment, platform 110 is supported on a recessed annular support surface 21 of heater housing 22. Furthermore, second member 118 includes at least one positioning member 142 such as a downwardly extending positioning pin, which extends into a cooperating surface 44, preferably an elongated or slotted recess, of recessed annular support surface 21 of housing 22. In this manner, second member 118 is rotatably coupled with housing 22 and yet is unrestrained in the radial direction to permit radial thermal expansion of 118 during the thermal processing of substrate 12. Similarly, second member 118 includes at least one second positioning member 146, such as an upwardly extending position pin, which extends into a cooperating surface 148, such as an elongated or slotted or recess, which rotatably couples second member 118 with first member 114.

As best seen in FIG. 5, support surface 116 of first member may include a plurality of transverse holes or apertures 122 in addition to lift openings 154a, 154b, 154c, and 154d, which permit unimpeded heat transfer from heater assembly 24 to substrate 12 during the thermal processing of substrate 12. Apertures 122 may be provided in a uniform pattern or may be provided in a non-uniform pattern, for example, with more apertures provided at the perimeter than at the central portion of support surface 116. Furthermore, apertures 122 permit cooling of substrate 12 after the thermal processing of substrate 12. Moreover, inert gases, such as nitrogen, argon, or helium, may be injected into heater housing 22 and directed to substrate 12 through apertures 122 in platform 10 to cool substrate 12. Although apertures 122 may permit transmission of photon energy from heater assembly 24 into the processing chamber of reactor 13 when semiconductor wafer 12 becomes opaque during heating, substrate 12 is opaque only for a discrete range of temperatures and remains opaque for a short duration. Furthermore, by including apertures 122, the heat up rate of substrate 12 is increased by locally eliminating a portion of platform 110. Moreover, apertures 122 may provide a substrate wafer backside showerhead gas injection system for cooling the wafer after processing with a suitable inert gas.

Referring to FIG. 6, a third embodiment of a platform 210 is illustrated. Similar to the previous embodiments, platform 210 includes a first member 214 for supporting substrate 12 and a second member 218 for supporting first member 214 and substrate 12 on housing 22. In order to reduce the hoop stresses in first member 214 due to the rapid heating process, first member 214 includes a transverse slot or splice 211, which extends radially outward from a central portion of support surface 216 to the free edge 214c of first member 214. Preferably, transverse slot or splice 211 extends from one of the substrate lifter holes 254a, 254b, 254c, or 254d to outer free edge 214c of first member 214.

As best seen in FIG. 7, slot 211 is preferably angled with respect to the support surface 216 of first member 214 so that leakage of light from heating assembly 24 into the processing chamber of reactor 13 is minimized. Furthermore, gas penetration from the processing chamber into the lamp area of heater housing 22 is minimized. Preferably, slot 211 forms an acute angle "A" between support surface 216 of first member 214 and the longitudinal axis 211a of slot 211. More preferably, slot 211 forms angle "A" in a range of about ten to thirty degrees. Most preferably, angle "A" is about twenty degrees.

Figure 8:
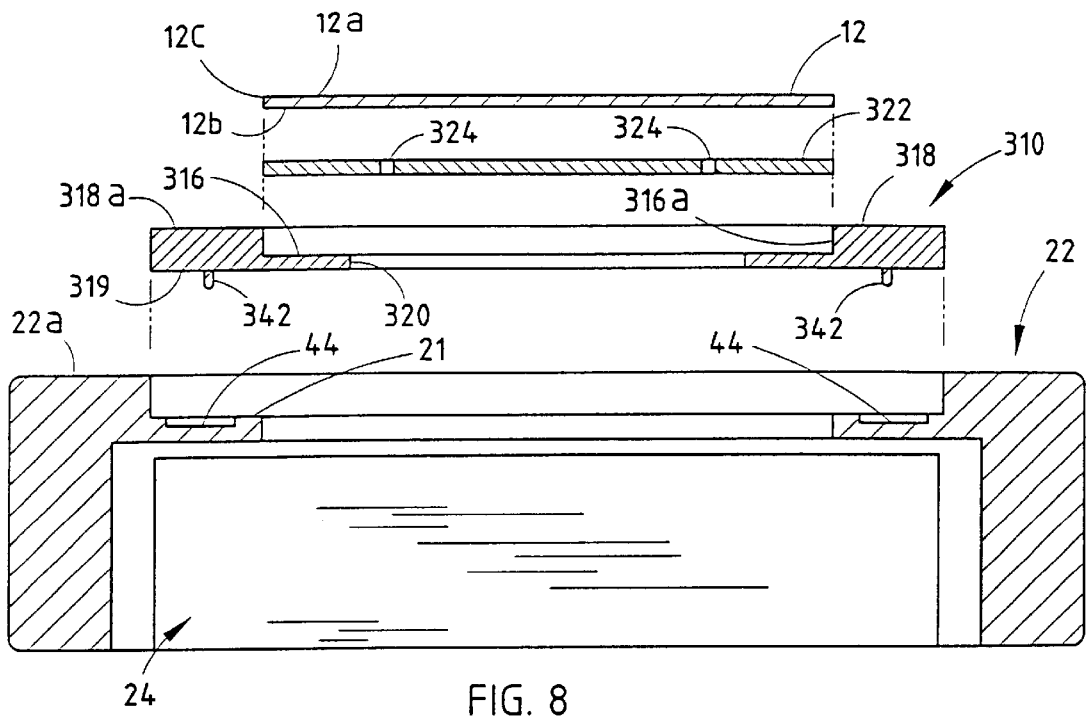
FIG. 8 is an exploded cross-section view of a fourth embodiment of the platform.
Figure 9:
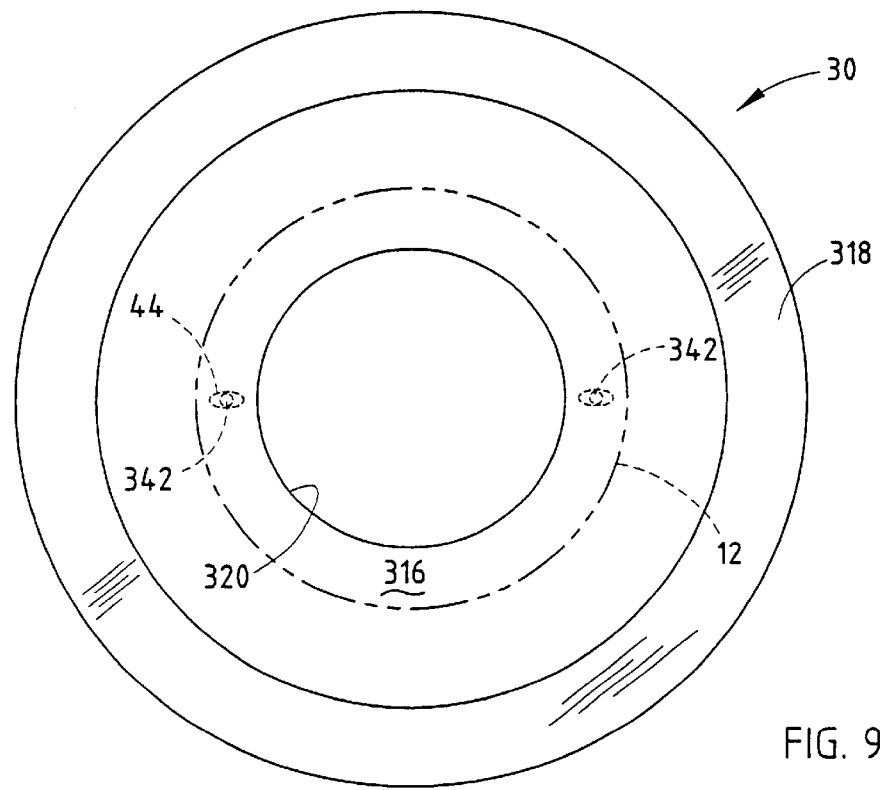
FIG. 9 is a top plan view of the platform in FIG. 8.

Referring to FIGS. 8 and 9, a further embodiment of platform 310 is illustrated. Platform 310 comprises a generally disc-shaped annular member or base 318 which includes an annular substrate support surface 316 on one side of member 318 and a mounting or platform support surface 319 on an opposed side of member 318. Platform 310 is preferably constructed from silicon carbide coated graphite, or other suitable materials. Reference is made to the first embodiment of platform 10, for other examples of suitable materials. Substrate support surface 316 is sized to support substrate 12 in a radially unrestrained manner. Preferably, substrate support surface 316 is sized to leave a gap, for example a gap of about 0.025 inches between the peripheral wall 316a surrounding recessed surface 316 and the perimeter 12c of substrate 12. In this way, when substrate 12 is subject to high temperatures, during processing, substrate 12 is radially unrestrained by platform 310 and is, therefore, free to undergo unrestrained thermal expansion.

Substrate support surface 316 is defined by a stepped or recessed annular surface which is preferably centrally located on annular base 318 and which defines a central opening 320. The size of central opening 320 can be varied and is primarily a function of the size of substrate 12. Generally, the larger the substrate, the larger the central opening 320 may be. However, as central opening 320 is increased, central opening 320 encroaches on the width of support surface 316. Therefore, the size of central opening 320 is limited by a minimum support surface width, for example 0.050 inches. Central opening 320 permits a large section or portion of the non-device side 12b of substrate 12 to be directly exposed to the heat flux from heater assembly 24. This results in a substantially unimpeded heating of substrate 12 by heater assembly 24. Although, central opening 320 also may permit the transmission of photon energy from heater assembly 24 into the processing chamber of reactor 13 until the substrate 12 becomes opaque during heating, substrate 12 is non-opaque only over a discrete range of temperatures. These temperatures are typically below the normal processing temperature of substrate 12; therefore, substrate 12 is non-opaque for a short duration only either during the ramp-up stages, when heater assembly 24 increases the heat flux to the processing temperature or during the ramp-down stages when heater assembly 24 is turned off and cools down.

It can be appreciated that by eliminating the central portion of platform 310, the heat-up rate of substrate 12 is substantially increased. In addition, central opening 320 permits lifter pins (not shown in this embodiment) to raise substrate 12 off platform 310 after processing. Reference is made to the first embodiment of the platform for further details of the lifter pins and reactor 13. Similar to the apertures 122 of the second embodiment, central opening 320 may also be subsequently used to provide access to substrate 12 for cooling the substrate after processing. In other words, both sides 12a and 12b of substrate 12 are accessible and exposed for cooling, but only the device side 12a is exposed to the reactor gases when the substrate is placed in the processing chamber.

As best seen in FIG. 8, annular base 318 also includes at least two couplers, such as projecting positioning members 342, which releasably secure annular base 318 to second housing 22. Similarly to the previous embodiments, when platform 310 is supported on second housing 22, positioning members 342 seat in corresponding couplers, such as receiving structures or recesses 44, preferably slotted apertures or grooves, provided in platform support surface 21. In this manner, platform 310 is rotatably coupled to housing 22 and yet is radially unrestrained. It should be understood that support surface 21 may include projecting positioning members, and platform 310 may include corresponding receiving structures.

Again, similar to the previous embodiments, platform 310 provides a stacking arrangement whereby each of the component parts, in this particular embodiment, annular base 320 and substrate 12, are thermally unrestrained. This is achieved by oversizing the recessed substrate surface and by over sizing the platform support surface 21 of housing 22 as will be more fully described below.

In addition, recessed annular support surface 316 is preferably recessed to a depth at least equal to the thickness of the substrate so that substrate 12, when seated on support surface 316, is substantially flush with a top surface 318a of annular base 318. For example, for a platform having 0.25 inch thickness, support surface 316 is preferably recessed in a range of about 1/8 to about 3/16 inch, which leaves 1/8 inch to 1/16 inch thickness of the platform for supporting substrate 12 thereon. As described in reference to the earlier embodiments, support surface 21 of housing 22 is similarly recessed at least equal to the thickness of platform 310. In this manner, when substrate 12 is seated on platform 310 and platform 310 is seated on support surface 21 of housing 22, both substrate 12 and platform 310 are substantially flush with a top surface 22a of housing 22.

Again, referring to FIG. 8, platform 310 may also include a disc insert 322, which covers central opening 320 and provides a gas barrier for substrate 12. Preferably, disc insert 322 comprises a quartz material and includes at least three and, preferably, four lifter pin holes 324 to allow the lifter pins (shown in previous embodiments) to extend through disc 322 to lift substrate 12 from platform 310. Where platform 310 includes disc 322, substrate support surface 316 is recessed further by the thickness of disc 322 to maintain the position of substrate 12 substantially flush with upper surface 318a of platform 310.

Figure 10:
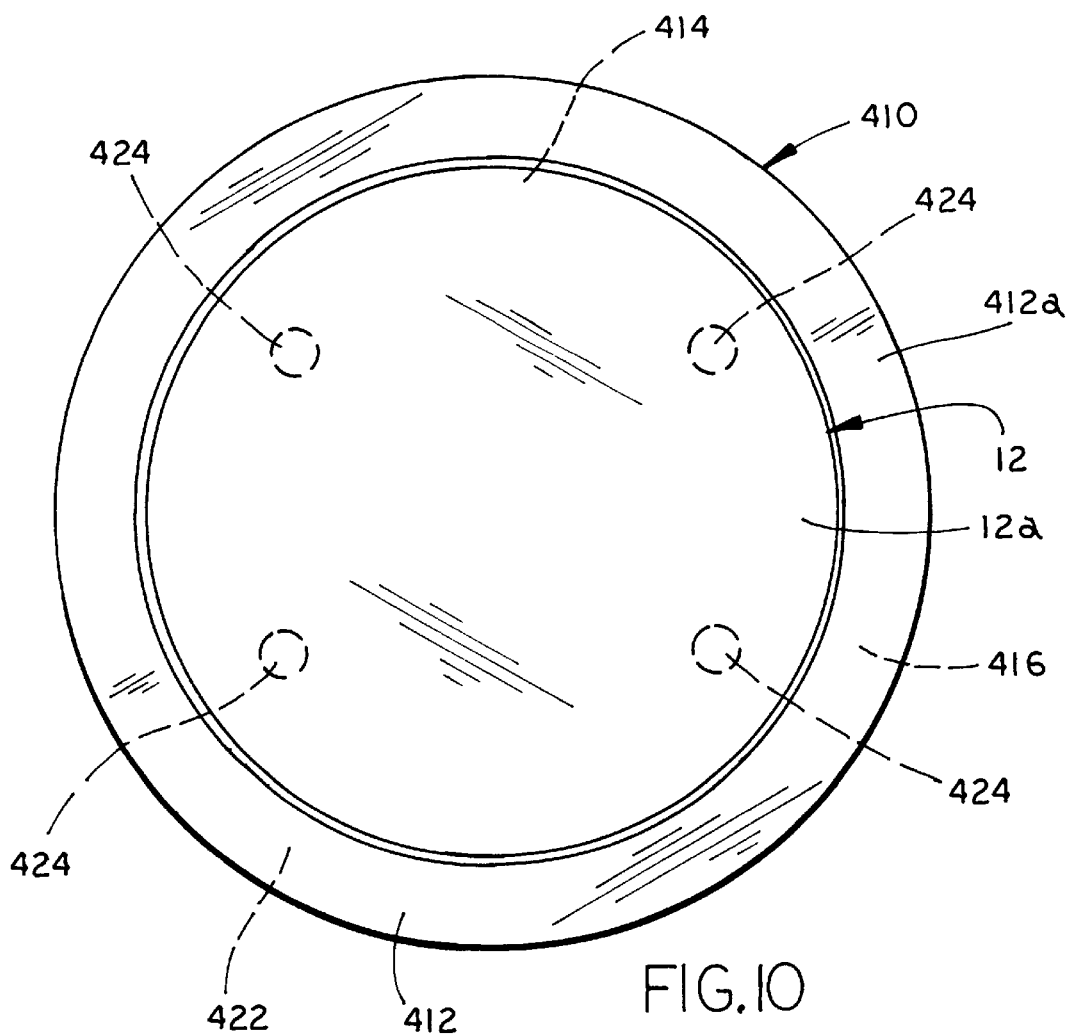
FIG. 10 is a plan view of a fifth embodiment of the platform.
Figure 11:
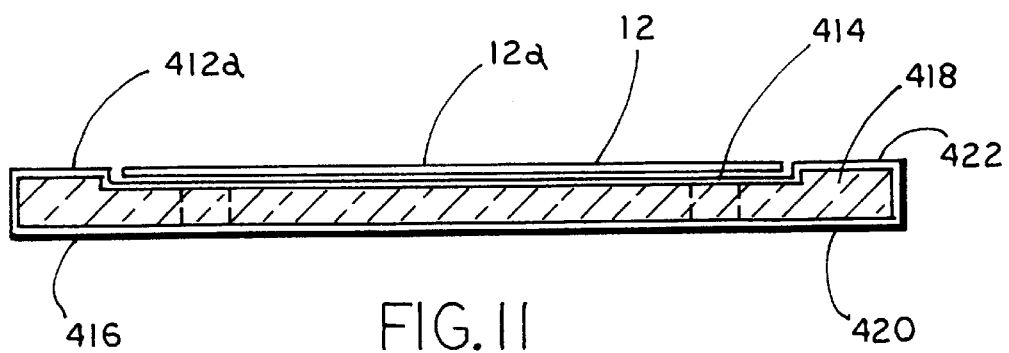
FIG. 11 is a cross-sectional view taken along line XI—XI of FIG. 10.

Referring to FIG. 10, a fifth embodiment of platform 410 is illustrated. Platform 410 comprises a generally disc-shaped member 412 which includes a first support surface 414 for supporting substrate 12 thereon. In preferred form, support surface 414 is recessed such that an upper surface 12a of substrate 12 is generally flush with an upper surface 412a of disc member 412, as shown in FIG. 11. Support surface 414 is preferably sized to permit unrestrained radial thermal expansion of substrate 12 and is, therefore, slightly larger than the substrate. Similar to the previous embodiments, platform 410 is supported by its lower surface 416 in housing 22 of reactor 13. Reference is made to the first embodiment for further details of housing 22 and reactor 13.

Referring to FIG. 11, platform member 412 is formed from a quartz substrate 418, which is coated with a layer or thin film of a material which causes the quartz substrate 418 to be opaque. In preferred form, the coating comprises a composite thin film or coating 420 of silicon and silicon carbide, which is preferably uniformly deposited on at least a perimeter portion 422 of quartz substrate 418, which extends around support surface 414. Coating 420 causes platform 410 to become optically opaque. In this manner, when substrate 12 is supported on support surface 414, the platform and substrate together block transmission of photon energy from the heater assembly which is positioned beneath the platform in housing 22 as described in more detail in reference to the first embodiment of platform 10. Thus, platform 410 becomes an isolating medium. Optionally, coating 420 may be deposited over an entire side or the entire surface of platform member 412, as shown in FIG. 11. In addition, since quartz has a reduced coefficient of thermal expansion as compared to graphite, platform 410 does not need to provide the same thermal expansion accommodations described in reference to the previous embodiments. As a result, platform 410 can withstand high temperature operations and extreme thermal shocks without damage while exhibiting excellent physical and chemical integrity.

Similar to the previous embodiments, preferably platform 410 includes a plurality of lift pin openings 424 and, preferably three or more pin openings, which permit substrate 12 to be lifted off platform 410 when the processing is complete.

Figure 12:
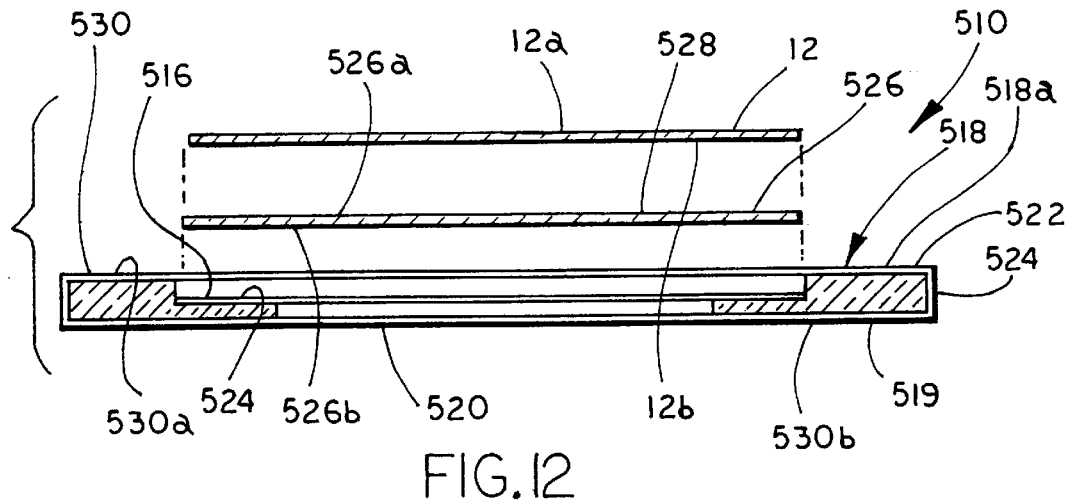
FIG. 12 is an exploded cross-section view of a sixth embodiment of the platform of the present invention.

Referring to FIG. 12, a sixth embodiment of platform 510 is illustrated. Platform 510 is of similar construction to platform 310. Platform 510 comprises a generally disc-shaped annular member or base 518 which includes an annular support surface 516 spaced radially inward on one side of platform 510 and a second or mounting support surface 519 on an opposed side of member 518. Similar to the previous embodiment, support surface 516 is recessed so that upper surface 12a of substrate 12 is generally flush with upper surface 518a of base 518 and, further, is sized so that substrate 12 is thermally unrestrained during heating.

Support surface 516 is defined by stepped or recessed annular surface which is preferably centrally located on base 518 and which defines a central opening 520. As described in reference to embodiment 310, central opening 520 permits a large section or portion of the non-device side 12b of substrate 12 to be exposed directly to the heat flux from heater assembly 24.

Similar to the previous embodiment, base 518 includes a quartz substrate 522 and a coating or film 524 over at least a portion of substrate 522 which results in an opaque base 518. In preferred form, at least one side of substrate 522 is coated and, most preferably as illustrated, quartz substrate 518 is coated over both sides, including support surface 516. In this manner, base 518 limits the transmission of photon energy from heater assembly 24, which is positioned beneath platform 510, into the processing chamber except for the portion of photon energy which may pass through central opening 520 until substrate 12 becomes opaque during heating. Though substrate 12 is substantially transparent when cool, upon heating, substrate 12 becomes opaque thus limiting transmission of light through substrate 12 during most of the heating process. In preferred form, coating 524 is formed from a composite thin film of silicon and silicon carbide which is deposited on the quartz substrate 522 in a manner described in more detail below.

Optionally, as described in reference to embodiment 310, platform 510 may include an insert 526, such as a quarts disc, which extends over opening 520 and which includes an upper surface to provide a substrate support surface 526a and a lower perimeter surface 526b which provides a support surface for insert 526 on base 518. In addition, insert 526 may include a plurality of lift pin openings 528 which permit substrate 12 to be lifted off platform 510.

In preferred form, coating 524 extends over at least perimeter portion 530 of base 518 and further over support surface 516. However, it should be understood that coating 524 may be localized over upper surface 530a of perimeter portion 530 or lower surface 530b of perimeter portion 530. In this manner, when platform 510 is assembled with substrate 12, platform 510 provides a barrier and limits the transmission of photon energy from the heater assembly into the processing chamber during most of the processing.

Figure 13:
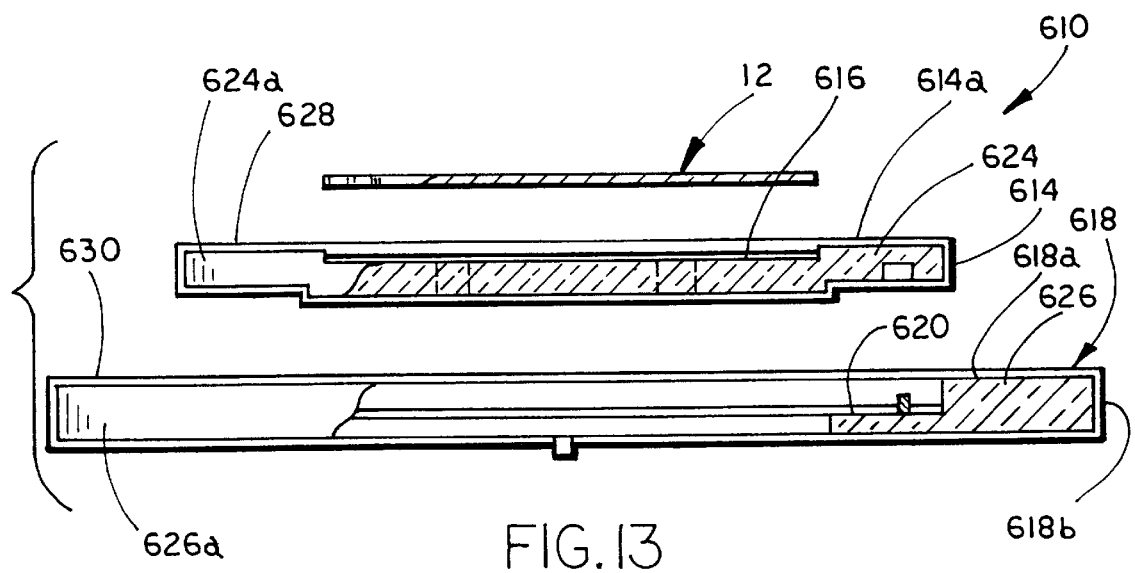
FIG. 13 is an exploded cross-section view of a seventh embodiment of the platform of the present invention.
Figure 14:
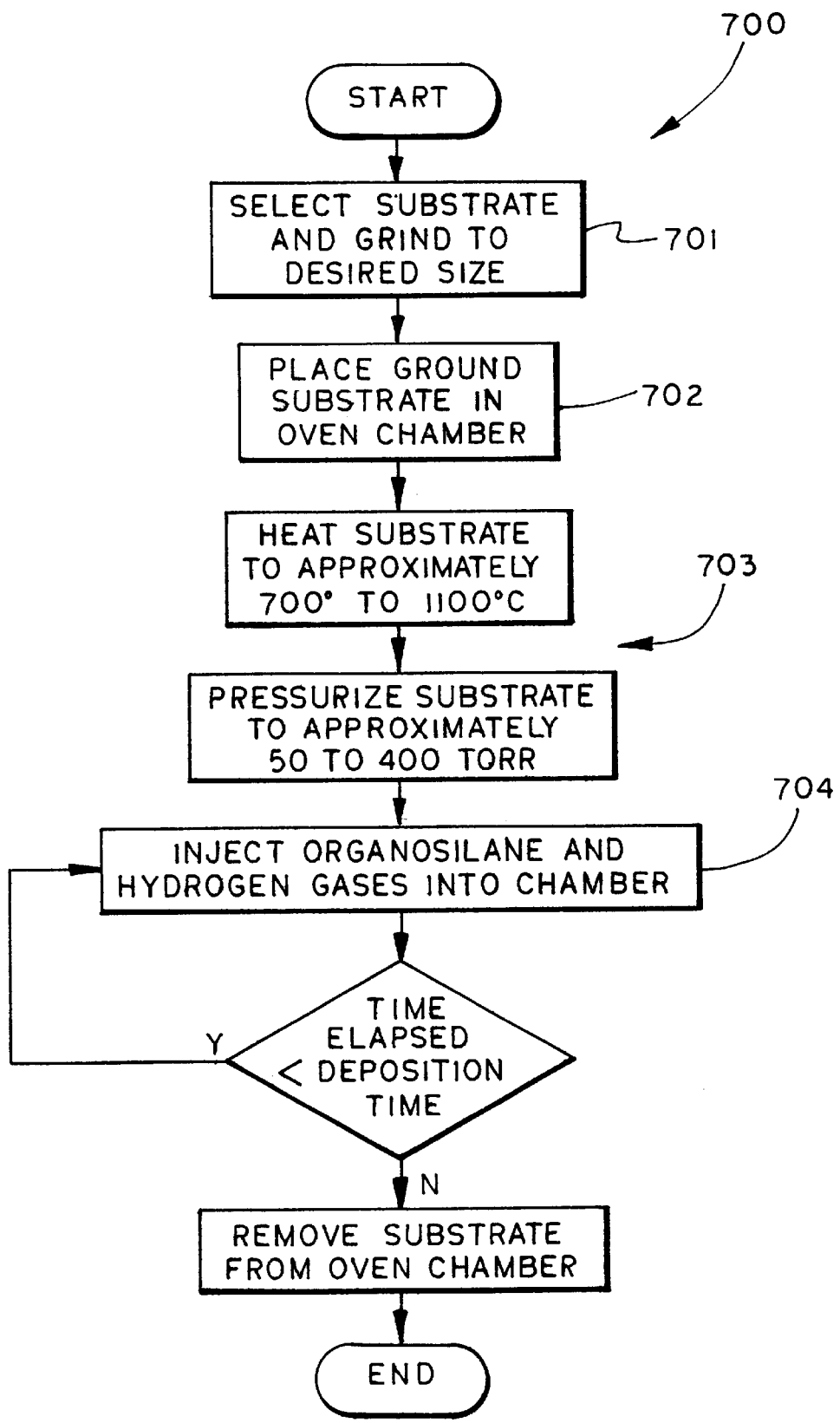
FIG. 14 is a flow chart of a method of making a composite quartz platform.

Referring to FIG. 13, a seventh embodiment 610 of the platform of the present invention is illustrated. Platform 610 is of similar construction to platform 10 and includes a first member 614 and a second member 618, which supports first member 614. First member 614 preferably comprises a disc member and includes a central recessed substrate support surface 616 for supporting substrate 12 thereon. Second member 618 preferably comprises an annular disc member with a recessed support surface 620 formed therein. Recessed support surface 616 is sized such that substrate 12 is supported substantially flush with an upper surface 614a of first member 614. Recessed support surface 620 is similarly sized so that first member 614 is supported substantially flush with an upper surface 618a of second member 618. In this manner, platform 610 provides a stacking arrangement of the substrate, first member 614 and second member 618, as previously described in reference to the first embodiment.

Similar to the previous two embodiments, platform 610 may include one or more platform members 614 or 618 that comprise quartz substrates 624, 626, with the other member comprising, for example, a silicon carbide coated graphite material. In preferred form, at least a portion of the quartz substrate 624 or 626 is coated to form an opaque first or second member 614 or 618, as described in reference to the previous embodiments. In preferred form, both platform members 614 and 618 include quarts substrates 624 and 626 with their respective coatings 628 and 630 extending over at least the perimeter portions 624a, 626a of the respective quartz substrates 624, 626 such that when assembled, transmission of photon energy from heater assembly 24 is minimized through platform 610. For example, the perimeter portion 626a of second member 618 may be coated on one or both sides. Similarly, first member 614 may be coated on a perimeter portion 624 either on its upper surface or its lower surface. In most preferred form, coatings 628 and 630 extend over an entire surface of each respective substrate 624, 626, including support surfaces 620 and 616. In this manner, platform 610 provides a complete barrier between the heater assembly 24 and the processing chamber.

It should be understood that with one or more members of platform 610 comprising a quartz material, accommodations for thermal expansion of the respective member may be essentially eliminated as previously noted since quartz does not exhibit the degree of thermal expansion as graphite.

In forming platforms 410, 510, or 610 (700), the respective quartz substrate 422, 522, 624, 626 is ground to a suitable size for the particular application (701). Once the quartz substrate is sized for its application, the quartz substrate is placed in a high temperature oven (702). In preferred form, the quartz substrate is heated to a temperature in a range of about 700° to 1100° C. and pressurized to a pressure in the range of 50 to 400 Torr (703). After reaching the desired temperature and pressure, organo-silane and hydrogen gasses are injected into the oven (704) to deposit a thin film of silicon and silicon carbide onto the quartz substrate. One preferred organo-silane compound is methyltrichlorosilane. However, other organo-silane compounds can be used. More preferably, the quartz substrate is heated to a temperature in a range of 900° to 1000° C. and pressurized to a pressure in a range of approximately 200 to 350 Torr. Preferably, the silicon and silicon carbide coated quartz has a thickness of at least 0.1 and more preferably 0.20 inches thick in order to provide an optically opaque coating. The final film thickness is a function of the deposition time. In preferred form, the desired film thicknesses are generally achieved in a range of about 2 to 5 hours. It should be understood from the foregoing that the ratio of silicon to silicon carbide in the film depends strongly on the hydrogen to organo-silane ratio in the gas which is injected into the oven, the pressure, and the temperature.

As previously described, part or all the platform components may be coated using this method. For example where only portions of the platform are coated, the parts that do not directly support the wafer are preferably coated with the silicon and silicon carbide film, with the wafer being supported by the transparent part of the platform. Furthermore, as previously described the platforms, for example, platform 610, may be formed from a combination of quartz and silicon carbide coated graphite members. For example, first member 614 may comprise a quartz member while second member 618 may comprise a silicon carbide coated graphite member. Since the quartz substrate does not undergo the same degree of thermal expansion as the graphite member, as noted, the accommodations for thermal expansion may only be provided for the graphite or other non-quartz material platform components.

For the purposes of the preceding description, the terms "upper" or "lower" and derivatives or equivalents thereof shall relate to the invention as oriented in FIGS. 1, 3, 4, 7, 8, and 11–13. It is understood that the invention may assume various alternative orientations, except where expressly specified to the contrary. It is also understood that the specific devices and methods illustrated in the attached drawings, and described in the preceding specification, are simply exemplary embodiments of the inventive concepts defined in the appended claims. Hence, specific dimensions and other physical characteristics relating to the embodiments disclosed herein are not to be considered limiting unless the claims expressly state otherwise.

While several forms of the invention have been shown and described, other forms will now be apparent to those skilled in the art. For example, the thickness of the platform members may be varied and the number of cooperating members and engagement surfaces may be increased. Moreover, the form of the cooperating members and engagement surfaces may be varied as would be understood by those persons having ordinary skill in the art. In addition, platforms 10, 110, 210, 310, 410, 510, and 610 may be used in other reactors with other lifting mechanisms, heating systems, and/or gas injection systems. Therefore, it will be understood that the embodiments shown in the drawings and described above are merely for illustrative purposes, and are not intended to limit the scope of the invention which is defined by the claims which follow.

I claim:

1. A platform for supporting a semiconductor substrate during processing in a processing chamber, the processing chamber having a heater and a rotatable housing, said platform comprising:

a body having a first support surface for supporting the substrate thereon and a second support surface for being supported by the rotatable housing over the beater in the processing chamber, said body comprising a quartz material, at least a portion of said quartz material being adapted to be opaque to block transmission of photon energy through said portion during heating, and wherein said body comprises first and second members, said first member including said first support surface, and said second member including said second support surface and a third support surface, said third support surface for supporting said first member on said second member.

2. The platform according to claim 1, wherein said quartz material includes a coating over at least a portion of said quartz material, said coating adapting said quartz material to be opaque.

3. The platform according to claim 1, wherein said body comprises a generally disc-shape body.

4. The platform according to claim 3, wherein said body comprises first and second members, said first member including said first support surface, and said second member including said second support surface and a third support surface for supporting said first member on said second member.

5. The platform according to claim 4, wherein said second member includes a central opening, said third support surface extending around said central opening, and said first member covering said central opening.

6. A platform for supporting a semiconductor substrate during processing in a processing chamber, the processing chamber having a heater and a rotatable housing, said platform comprising:

a first member having a first support surface for supporting the substrate thereon; and a second member having opposed sides, said opposed sides including second and third support surfaces, said first member being supported on said second support surface, and said third support surface for supporting said first and second members in the processing chamber over the heater by the rotatable housing, and at least one of said first member and said second member comprising a quartz material, at least a portion of said quartz material being adapted to be opaque to limit transmission of light from the heater to the processing chamber.

7. The platform according to claim 6, wherein said quartz material includes a coating over said portion, said coating adapting said quartz material to be opaque.

8. The platform according to claim 7, wherein said coating comprises a composite film of silicon and silicon carbide.

9. The platform according to claim 6, wherein said first member comprises said quartz material.

10. The platform according to claim 6, wherein said second member comprises said quartz material.

11. The platform according to claim 10, wherein said second member includes a peripheral portion, said peripheral portion extending around said second support surface, and at least said peripheral portion of said quartz material of said second member being adapted to be opaque.

12. The platform according to claim 6, wherein both said first and second members comprise quartz material.

13. The platform according to claim 7, wherein said coating extends over at least an entire side of said quartz material.

14. A platform for supporting a semiconductor substrate during processing in a processing chamber, the processing chamber having a heater and a rotatable housing, said platform comprising:

a support member having a central opening, a first side with a generally planar recessed surface, and a second side configured for being supported in the processing chamber over the heater by the rotatable housing, said recessed surface configured to support the substrate thereon and to permit unrestrained thermal expansion of the substrate.

15. The platform according to claim 14, further comprising a coupler rotatably coupling said support member to the rotatable housing.

16. The platform according to claim 14, wherein said support member includes a perimeter surface extending around said recessed surface, said recessed surface supporting the substrate substantially flush with said perimeter surface.

17. The platform according to claim 14, wherein said support member comprises an annular member.

18. The platform according to claim 14, further comprising an insert, said insert being supported on said recessed surface and covering said central opening, said insert providing a support surface for the substrate.

19. The platform according to claim 14, wherein said support member comprises a quartz material, at least a portion of said quartz material being adapted to be opaque.

20. The platform according to claim 19, wherein said support member includes a perimeter portion, said perimeter portion extending around said recessed surface, and said quartz material of at least said perimeter portion being adapted to be opaque.

21. The platform according to claim 19, wherein said quartz material includes a coating, said coating adapting said quartz material to be opaque.

22. The platform according to claim 21, wherein said coating comprises a film of a material selected from the group consisting of silicon and silicon carbide.

23. A platform for supporting a semiconductor substrate during processing in a processing chamber, the processing chamber having a heater and a rotatable housing, said platform comprising:

a body having a first support surface for supporting the substrate thereon and a second support surface for being supported by the rotatable housing over the heater in the processing chamber, said body comprising a quartz material, at least a portion of said quartz material being adapted to be opaque to block transmission of photon energy through said portion during heating, said quartz material including a coating over at least a portion of said quartz material, said coating adapting said quartz material to be opaque, and wherein said coating comprises a composite film of silicon and silicon carbide.

24. The platform according to claim 23, further comprising a coupler provided on said body, said coupler for rotatably coupling said body to the rotable housing.

25. The platform according to claim 23, wherein said first support surface comprises a recessed support surface, said recessed support surface being sized to permit unrestrained radial thermal expansion of the substrate during thermal processing.

26. The platform according to claim 23, wherein said body comprises a generally disc-shaped body.

27. The platform according to claim 23, wherein said body comprises first and second members, said first member including said first support surface, and said second member including said second support surface and a third support surface for supporting said first member on said second member.

28. The platform according to claim 23, wherein said second member includes a central opening, said third support surface extending around said central opening, and said first member covering said central opening.

29. A platform for supporting a semiconductor substrate during processing in a process chamber, the processing chamber having a heater and a rotatable housing, said platform comprising:

a body having a first support surface for supporting the substrate thereon and a second support surface for being supported by the rotatable housing over the heater in the processing chamber, said body comprising a quartz material, at least a portion of said quartz material being adapted to be opaque to block transmission of photon energy through said portion during heating, and a coupler provided on said body, said coupler for rotatably coupling said body to the rotatable housing.

30. The platform according to claim 29, wherein said body comprises first and second members, said first member including said first support surface, and said second member including said second support surface and a third support surface, said third support surface for supporting said first member on said second member.

31. The platform according to claim 30, wherein said second member includes a central opening, said third support surface extending around said central opening, and said first member covering said central opening.

32. The platform according to claim 29, wherein said first support surface comprises a recessed support surface, said recessed support surface being sized to permit unrestrained radial thermal expansion of the substrate during thermal processing.

33. The platform according to claim 29, wherein said quartz material includes a coating over at least a portion of said quartz material, said coating adapting said quartz material to be opaque.

34. A platform for supporting a semiconductor substrate during processing in a processing chamber, the processing chamber having a heater and a rotatable housing, said platform comprising:

a body having a first support surface for supporting the substrate thereon and a second support surface for being supported by the rotatable housing over the heater in the processing chamber, said body comprising a quartz material, at least a portion of said quartz material being adapted to be opaque to block transmission of photon energy through said portion during heating, and wherein said first support surface comprise a recessed support surface, said recessed support surface being sized to permit unrestrained radial thermal expansion of the substrate during thermal processing.

35. The platform according to claim 34, wherein said body comprises first and second members, said first member including said first support surface, and said second member including said second support surface and a third support surface, said third support surface for supporting said first member on said second member.

36. The platform according to claim 35, wherein said second member includes a central opening, said third support surface extending around said central opening, and said first member covering said central opening.

37. The platform according to claim 34, further comprising a coupler provided on said body, said coupler for rotatably coupling said body to the rotatable housing.

38. A substrate processing apparatus comprising:

a heater; and a substrate support comprising a first member and a second member, said first member including a first support surface for supporting a substrate thereon, said second member including a second support surface for supporting said first member over said heater, at least one of said first member and said second member comprising a quartz material, and at least a portion of said quartz material being provided with means for blocking transmission of photon energy from said heater through said portion.

39. A substrate processing apparatus comprising:

a heater; and a substrate support adapted to support a substrate, wherein said substrate support support the substrate on an opposite side to said heater with respect to said substrate support, said substrate support comprising a supporting member having a central opening and a support surface extending around said central opening and for supporting said first member, said supporting member comprising a quartz material, at least a portion of said quartz material being adapted to be opaque, said support surface including a recessed surface, and said recessed surface being configured to support the substrate thereon and to permit unrestrained thermal expansion of the substrate.

40. A substrate processing apparatus comprising:

means for heating a substrate; and substrate supporting means for supporting the substrate, and means for supporting said substrate supporting means over said means for heating, where in said substrate supporting means comprises a first member including a first support surface for supporting the substrate thereon and a second member including a second support surface for supporting said first member, at least one of said first member and said second member comprising a quartz material, and at least a portion of said quartz material being provided with means for blocking transmission of photon energy from said means for heating through said portion.

41. A substrate processing apparatus comprising:

means for heating a substrate; and means for supporting the substrate, wherein said means for supporting supports the substrate on an opposite side to said means for heating with respect to said means for supporting, said means for supporting comprising a supporting member having a central opening and a support surface extending around said central opening, said supporting member comprising a quartz material, at least a portion of said quartz material being adapted to be opaque, said support surface including a recessed surface, and said recessed surface being configured to support the substrate thereon and to permit unrestrained thermal expansion of the substrate.

* * * * *

UNITED STATES PATENT AND TRADEMARK OFFICE
CERTIFICATE OF CORRECTION

PATENT NO. : 6,530,994 B1  Page 1 of 1
APPLICATION NO. : 09/419555
DATED : March 11, 2003
INVENTOR(S) : Mahawili It is certified that error appears in the above-identified patent and that said Letters Patent is hereby corrected as shown below:

Column 1:
Line 7, Insert --co-pending-- after "of".
Line 12, Insert --co-pending-- after "of".

Column 13:
Line 15, "beater" should be --heater--.
Line 31-36, Please delete claim 4.

Column 14:
Line 66, "rotable" should be --rotatable--.

Column 15:
Line 17, "process" should be --processing--.
Line 60, "comprise" should be --comprises--.

Column 16:
Line 25, "support" should be --supports--.
Line 41, "where in" should be --wherein--.

Signed and Sealed this

First Day of August, 2006

JON W. DUDAS
*Director of the United States Patent and Trademark Office*